(12) United States Patent
Giessmann et al.

(10) Patent No.: US 7,741,860 B2
(45) Date of Patent: Jun. 22, 2010

(54) PROBER FOR TESTING MAGNETICALLY SENSITIVE COMPONENTS

(75) Inventors: Sebastian Giessmann, Wildenhain (DE); Stefan Kreissig, Venusberg (DE); Stojan Kanev, Thiendorf OT Sacka (DE)

(73) Assignee: SUSS MicroTec Test Systems GmbH, Sacka (DE)

( * ) Notice: Subject to any disclaimer, the term of this patent is extended or adjusted under 35 U.S.C. 154(b) by 9 days.

(21) Appl. No.: 12/145,090

(22) Filed: Jun. 24, 2008

(65) Prior Publication Data

US 2009/0058442 A1   Mar. 5, 2009

(30) Foreign Application Priority Data

Sep. 3, 2007   (DE) ...................... 10 2007 041 608

(51) Int. Cl.
*G01R 1/02* (2006.01)
*G01R 31/28* (2006.01)
(52) U.S. Cl. ...................................... 324/754; 324/755

(58) Field of Classification Search .................. None
See application file for complete search history.

(56) References Cited

U.S. PATENT DOCUMENTS

| | | | | |
|---|---|---|---|---|
| 5,091,691 A | * | 2/1992 | Kamieniecki et al. | ....... 324/765 |
| 5,828,224 A | * | 10/1998 | Maruyama | ................... 324/755 |
| 6,545,580 B2 | * | 4/2003 | Hegde et al. | ................. 335/296 |

* cited by examiner

*Primary Examiner*—Paresh Patel
(74) *Attorney, Agent, or Firm*—Heslin Rothenberg Farley & Mesiti P.C.

(57) ABSTRACT

A prober for testing components comprises a lower frame, over which a probe holder plate is disposed at a distance therefrom for receiving test probes that make contact with the components to be tested and to which a displacement device is connected. A substrate carrier is disposed in the space between the frame and the probe holder plate, and the probe holder plate is provided with an opening, below which the substrate carrier can be displaced. To expand the scope of application of probers used for testing components, all those components of the prober that surround the substrate are made from a non-magnetic material.

12 Claims, 2 Drawing Sheets

PROBER FOR TESTING MAGNETICALLY SENSITIVE COMPONENTS

CROSS REFERENCE TO RELATED APPLICATION

Figure 1:
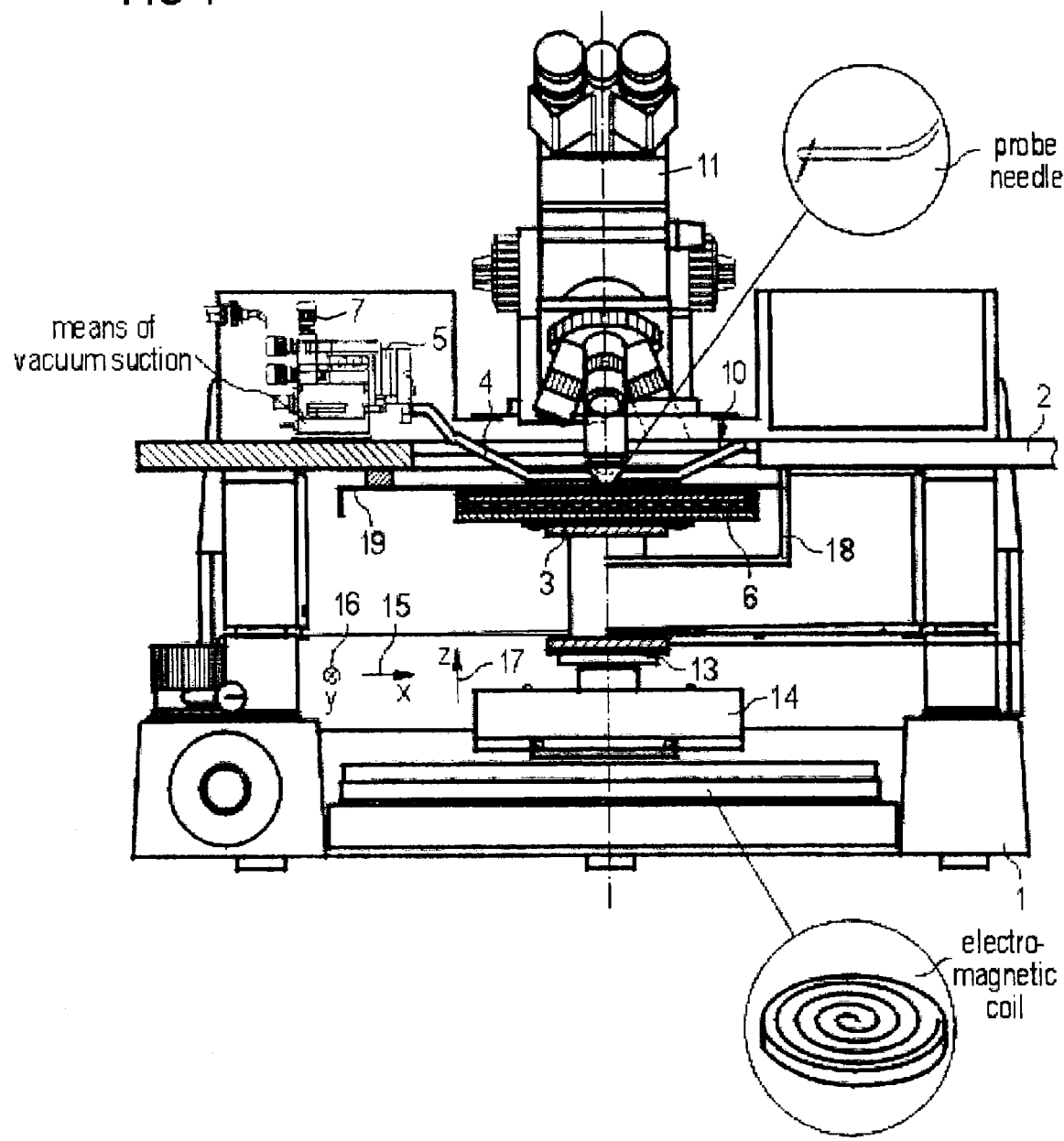

This application claims priority of German application No. 10 2007 041 608.5 filed on Sep. 3, 2007, the entire disclosure of this application being hereby incorporated herein by reference.

BACKGROUND ART

The present invention relates to a prober for testing components, which prober comprises a lower frame, over which a probe holder plate is disposed at a distance therefrom for receiving test probes that make contact with the components to be tested. A displacement device, on which a substrate carrier is disposed in the space between the frame and the probe holder plate, is connected to the frame. The probe holder plate is provided with an opening, below which the substrate carrier can be displaced.

Probers of this type are used for testing components such as semiconductor chips in a wafer package. The semiconductor wafer is placed on the substrate carrier and clamped on the latter. The semiconductor wafer clamped in this way is tested chip by chip by making contact with contact pads present on the chip, applying measurement signals to them, and measuring or determining their reaction to these measurement signals. Test probes are provided for making contact with the contact pads. These test probes are pre-assembled before the actual test procedure. In principle, there are two alternatives for arranging the test probes.

According to the first alternative, the test probes can be designed in the form of test needles, which have associated needle supports, one end of which is then clamped in probe holders. The probe holders are then mounted on the probe holder plate in such a way that the needle points of the test probes corresponding to the pattern of contact pads on the semiconductor chip to be tested penetrate the opening in the probe holder plate.

The second possibility for arranging test probes involves so-called probe cards, in which the needles are already pre-assembled on a card. Corresponding electric conductors and sometimes also electronics, for example, an amplifier, are disposed on this card. The probe card is inserted into the probe holder plate using a probe card adapter in most cases and fixed therein. The needles on the probe card serve for making contact with the contact pads on the semiconductor.

Furthermore, the purpose of use and structure of the prober likewise differ from each other. Thus, for example, so-called vacuum probe systems are known from the prior art in which the components are tested in a vacuum environment. The means for clamping the semiconductor wafer on the substrate carrier must also be designed accordingly. While the substrate carrier can be provided with vacuum clamping devices under normal atmospheric conditions, a vacuum environment requires the provision of other clamping mechanisms, for example, mechanical clamping devices. The basic structure of such vacuum probe systems does not differ from that described above.

Furthermore, it is known from the prior art to expose the components to be tested to defined thermal conditions, for example, heating them up during the testing procedure. For this purpose, the substrate carrier is equipped with a special heating system, which then enables the application of high temperatures to the components to be tested. Naturally, it is also possible to test the components in a lower temperature range, in which case the substrate carrier then ensures a corresponding cooling of the substrate to be tested.

Although these known probers are suitable for testing a plurality of different components, for example, semiconductor chips or so-called MEMs (Micro-Electro-Mechanical components) such as sensors, it has been found that these probers are not suitable for testing magnetic components such as magnetic memory (MRAM-Magnetic Random Access Memory) by way of example, i.e. components, which display a function as a result of magnetic excitation.

BRIEF SUMMARY OF THE INVENTION

It is an aspect of the invention to expand the scope of application of probers used for testing components.

According to the invention, this aspect is achieved by producing all those components of the prober that surround the substrate from a non-magnetic material. It is thus possible to use suitable means, such as magnetic elements disposed in the vicinity of the test probes, to magnetically excite the components during the test procedure and thus test their magnetic function while simultaneously ensuring that the magnetic excitation is not influenced by parts like the substrate carrier. If the substrate carrier were made of magnetic material by way of example, it would uncontrollably affect the magnetic fields that are meant to influence the component to be tested unless a shield is provided, if appropriate. The production of the substrates surrounding the component from non-magnetic material helps overcome this disadvantage and thus expands the scope of application of such probers to include magnetically sensitive components as well.

In one embodiment of the invention, an electromagnetic shield encasing the test probes and the substrate carrier is disposed below the probe holder plate. Such a shield ensures that external magnetic fields also do not exert an interfering influence on the test procedure. For example, drive systems, power supply lines, and the like generate electromagnetic fields, which then affect a magnetically sensitive test substrate and thus can falsify the test result. The electromagnetic shield of the invention can prevent these unfavorable effects.

In another embodiment, the magnetic shield includes at least parts of the displacement device by encasing the latter at least partially. Such an encasement can simplify the mechanical design of the shield since the displacement device would only perform one-way movements or none at all. Furthermore, such an encasement can also prevent the entry of electromagnetic fields generated by the displacement device itself.

The displacement device usually comprises an x-y cross-table. This x-y cross-table can be displaced in an x-direction and a y-direction located perpendicular thereto, both of which are located in a plane lying parallel to the probe holder plate.

Furthermore, the displacement device usually comprises a z-drive, which displaces the substrate carrier in a z-direction located perpendicular to the probe holder plate. In principle, it is also possible to rotate the substrate carrier by an angle θ about a rotation axis located perpendicular to the probe holder plate.

In a first embodiment, the shield encases the x-y cross-table and comprises only one opening enabling the z-drive to penetrate the shield. In this case, the z-drive is outside the shield and the x-y cross-table is lifted together with the substrate carrier. Thus only one opening allowing the lifting movement is required in the shield, which simplifies the design of this embodiment.

In another embodiment of the invention, the displacement device with the x-y cross-table and the z-drive is located entirely outside the shield and thus completely prevents a magnetic field from entering the shield. For this purpose, the shield is provided with an opening, which releases the displacement in the x, y, and z-directions, for the passage of a connection of a displacement device to the substrate carrier.

In another embodiment of the invention, a unit generating a magnetic field in the substrate is connected to the prober. Said unit can be an electromagnet, which is otherwise not magnetic and which generates a magnetic field within a coil by means of a current flow.

In one embodiment of the invention, the test probes are disposed on a probe card, and the shield encases the probe card. Such a probe card is particularly suitable for performing automatic test procedures at relatively high speed. The high expenditure of producing such a probe card thus proves to be profitable.

When using such a probe card, it is possible according to another embodiment, to provide the probe card with an electromagnetic coil generating a magnetic field in the substrate. The constant presence of this coil in the vicinity of the component to be tested enables direct magnetic influence.

The invention enables the generation of a magnetic field even more purposefully by providing electromagnetic coils that enclose the test probes. It is then also possible to apply a magnetic field to the surroundings of individual contact points of the components that are to be tested.

A different or additional possibility for generating the magnetic field suggests that an electromagnetic coil generating a magnetic field in the substrate be disposed in the substrate carrier.

The simplest way to design the substrate carrier according to the idea of the invention is to produce that part of the substrate carrier that is located below the test probes from a non-magnetic material. It is thus possible to achieve the desired effect of preventing an influence of the magnetic field in the component to be tested by using relatively less amounts of non-magnetic material. Finally, this also involves a cost advantage in terms of production.

In contrast, the substrate carrier may be entirely made of a non-magnetic material. This is in turn advantageous in the case of automatic probers, in which an entire semiconductor wafer is clamped on the substrate carrier, and this semiconductor wafer is tested step by step and component by component. The production of the entire surface of the substrate carrier from non-magnetic material ensures that the magnetic field in the substrate is influenced at every point of the substrate carrier.

BRIEF DESCRIPTION OF THE DRAWING FIGURES

The invention will be explained below in more detail with reference to an exemplary embodiment. In the associated drawings, FIG. 1 shows an embodiment of the prober of the invention, which prober comprises probe holders, and FIG. 2 shows an embodiment of the prober of the invention, which prober comprises a probe card.

DETAILED DESCRIPTION

In both illustrations, the prober of the invention comprises a lower frame 1, over which a probe holder plate 2 is disposed at a distance therefrom. This probe holder plate 2 serves for receiving test probes 3. In the exemplary embodiment shown in FIG. 1, these test probes 3 comprise test needles, which are connected to a probe holder 5 by means of needle supports 4. The probe holder 5 can in turn be fixed on the probe holder plate 2, for example, by means of vacuum suction on the lower side of the probe holder 5. The probe holder 5 comprises an adjusting mechanism 7 enabling the fine adjustment of the test probes 3 on the component that is to be tested (not illustrated in the exemplary embodiment) and is placed on the upper side of the substrate carrier 6 during the test. It is thus possible for a plurality of probe holders 5 to adjust the test probes such that they correspond to the pattern of the contact pads on the component to be tested.

Figure 2:
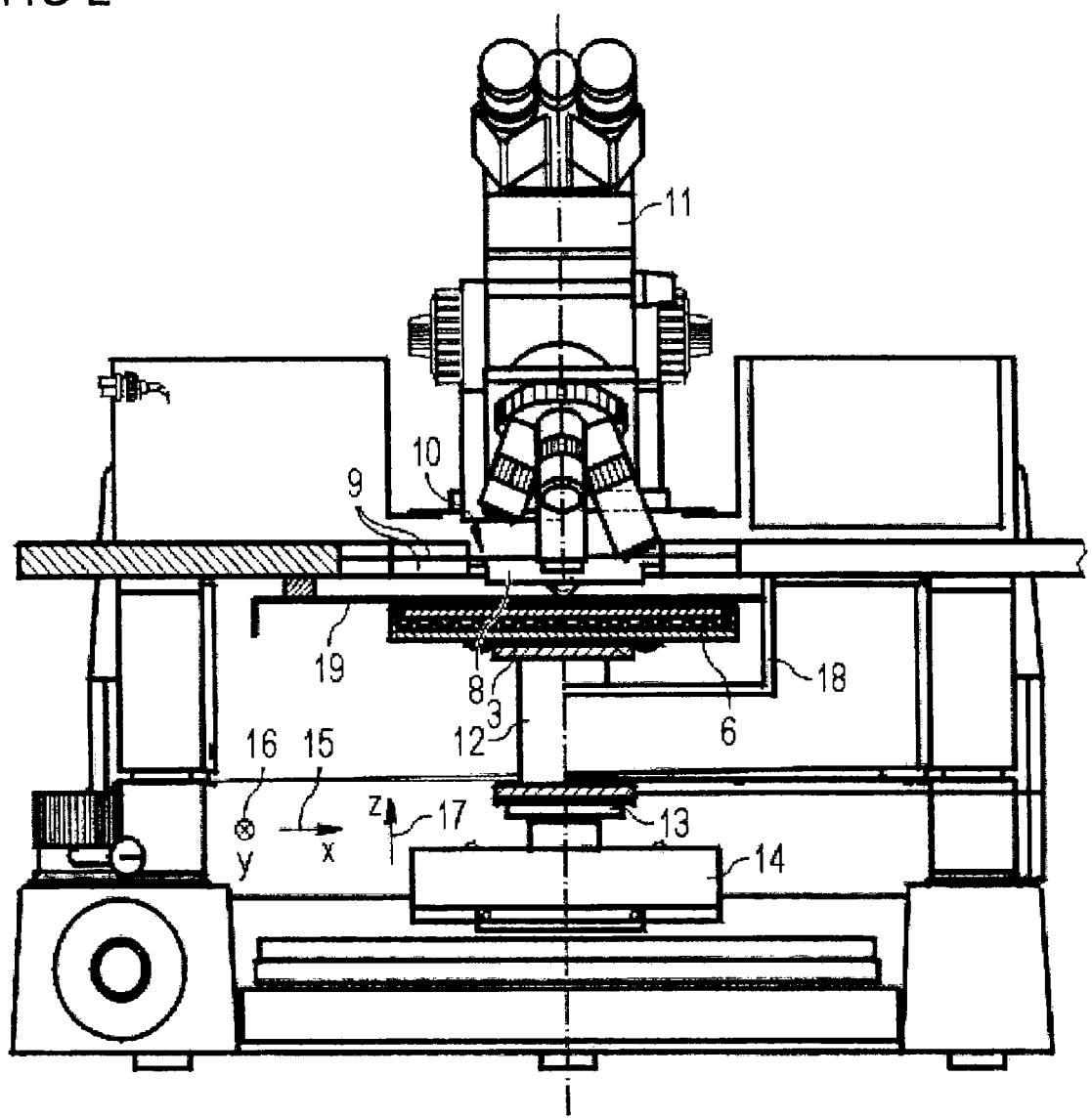

As shown in FIG. 2, the test probes 3 are disposed on a probe card 8. The probe card 8 is connected to the probe holder plate 2 by means of a probe card adapter 9. The test probes 3 on the probe card 8 are disposed in such a way that they correspond to the pattern of the contact surfaces on the component to be tested.

The probe holder plate 2 is provided with an opening 10 for the passage of the test probes 3 or the needle supports 4 shown in FIG. 1 or for inserting the probe card 8 into the probe card adapter 9. This opening 10 is also used for observing the component to be tested through a microscope 11.

The substrate carrier 6 is fixed on a support 12, which is connected to a z-drive 13, which in turn is fixed on an x-y cross-table 14. This x-y cross-table and the z-drive enable the substrate carrier 6 to be displaced in the x-direction 15, a y-direction 16 located perpendicular to the x-direction 15, and a z-direction located perpendicular to the probe holder plate 2. Furthermore, it is also possible for this drive to rotate the probe holder 5 about a rotation axis located perpendicular to the probe holder plate 2. This rotary movement is not described in detail here since it departs from the tenor of the invention.

In the exemplary embodiment shown in FIG. 1, the test probes 3, the needle supports 4, the probe holder plate 2, and the substrate carrier 6 are made of non-magnetic material. An electromagnetic coil (not illustrated), through which current flows in order to generate a magnetic field in the substrate or in the component to be tested, is disposed in the substrate carrier 6. The production of said components from non-magnetic material ensures that this magnetic field is free from interference and reproducible in every test procedure.

For improving the reproducibility of the measurement results, an electromagnetic shield is further provided, which comprises a shielding trough that is connected to the probe holder plate 2. This trough encases the substrate carrier 6 and parts of the support 12. This shielding trough 18 has a lower opening, which the support 12 can penetrate.

Additionally, the shielding effect is completed by arranging an upper shielding plate 19 in the shielding trough 18. The shielding plate 19 is located parallel to the lower side of the probe holder plate and is likewise provided with an opening, which the test probes 3 can penetrate and which can be used for observation through a microscope 11.

In the exemplary embodiment shown in FIG. 2, the probe holder plate 2, the probe card adapter 9, the probe card 8, and the substrate carrier 6 are similarly made of non-magnetic material. Here too, a shield comprising a shielding trough 18 and a shielding plate 19 are disposed in a similar fashion.

The invention claimed is:

1. Prober for testing components, comprising: a lower frame, a probe holder plate disposed over and at a distance from the lower frame for receiving test probes that make contact with the components and to which a displacement device is connected, a substrate carrier disposed in a space between the frame and the probe holder plate, the substrate carrier being adapted to be displaced below an opening in the probe holder plate, wherein all components of the prober surrounding a substrate on the substrate carrier are made of a non-magnetic material.

2. Prober according to claim 1, wherein an electromagnetic shield encasing the test probes and the substrate carrier is disposed below the probe holder plate.

3. Prober according to claim 2, wherein the magnetic shield encases the displacement device at least partially.

4. Prober according to claim 2, wherein the displacement device comprises an x-y cross-table for displacing the substrate carrier in an x-direction and a y-direction perpendicular to the x-direction, both the x-direction and the y-direction located in a plane lying parallel to the probe holder plate, and a z-drive for displacing the substrate carrier in a z-direction perpendicular to the probe holder plate, and the shield encases the x-y cross-table and comprises an opening, which the z-drive can penetrate.

5. Prober according to claim 2 wherein the displacement device comprises an x-y cross-table, for displacing the substrate carrier in an x-direction and a y-direction perpendicular to the x-direction, both the x-direction and the y-direction being located in a plane lying parallel to the probe holder plate, and a z-drive, for displacing the substrate carrier in a z-direction perpendicular to the probe holder plate, and wherein the displacement device is disposed outside the shield and the shield comprises an opening, which releases a displacement in the x, y, and z-directions, for passage of a connection of the displacement device to the substrate carrier.

6. Prober according to claim 1 wherein a unit generating a magnetic field in a substrate on the substrate carrier is connected to the prober.

7. Prober according to claim 6 wherein an electromagnetic coil generating a magnetic field in the substrate is disposed on the probe card.

8. Prober according to claim 6 wherein an electromagnetic coil generating a magnetic field in the substrate is disposed in the substrate carrier.

9. Prober according to claim 8 wherein the substrate carrier is entirely made of a non-magnetic material.

10. Prober according to claim 1 wherein the test probes are disposed on a probe card, and the probe card is encased by the shield.

11. Prober according to claim 10 wherein electromagnetic coils are disposed such that the coils enclose the test probes.

12. Prober according to claim 1 wherein part of the substrate carrier located below the test probes is made of a non-magnetic material.

* * * * *